United States Patent
Walter et al.

(10) Patent No.: US 7,238,964 B2
(45) Date of Patent: Jul. 3, 2007

(54) MEMORY CELL, METHOD FOR THE PRODUCTION THEREOF AND USE OF A COMPOSITION THEREFOR

(75) Inventors: Andreas Walter, Egloffstein (DE); Recai Sezi, Roettenbach (DE); Reimund Engl, Nuremberg (DE); Anna Maltenberger, Leutenbach (DE); Joerg Schumann, Dresden (DE); Thomas Weitz, Duerkheim (DE)

(73) Assignee: Infineon Technologies AG, Munich (DE)

( * ) Notice: Subject to any disclaimer, the term of this patent is extended or adjusted under 35 U.S.C. 154(b) by 338 days.

(21) Appl. No.: 11/044,762

(22) Filed: Jan. 27, 2005

(65) Prior Publication Data

US 2005/0179033 A1 Aug. 18, 2005

(30) Foreign Application Priority Data

Jan. 30, 2004 (DE) .................. 10 2004 004 863

(51) Int. Cl.
*H01L 29/04* (2006.01)
*H01L 31/20* (2006.01)
*H01L 33/00* (2006.01)

(52) U.S. Cl. ........................................ 257/59; 257/103
(58) Field of Classification Search .................. 257/59, 257/87–103
See application file for complete search history.

(56) References Cited

U.S. PATENT DOCUMENTS

| | | | |
|---|---|---|---|
| 4,652,894 A | 3/1987 | Potember et al. | |
| 5,144,473 A | 9/1992 | Gemma et al. | |
| 5,151,528 A | 9/1992 | Mukai et al. | |
| 5,849,403 A | 12/1998 | Aoki et al. | |
| 6,055,180 A | 4/2000 | Gudesen et al. | |
| 6,381,169 B1 | 4/2002 | Bocian et al. | |
| 6,451,942 B1 | 9/2002 | Li et al. | |
| 6,626,566 B2 * | 9/2003 | Holmes et al. | ............ 257/59 |

FOREIGN PATENT DOCUMENTS

| | | |
|---|---|---|
| EP | 0 450 862 A2 | 10/1991 |
| EP | 0 454 874 A1 | 11/1991 |
| EP | 0 390 571 B1 | 8/1994 |
| GB | 1 600 789 A | 10/1981 |

OTHER PUBLICATIONS

Bandyopadhyay A., Pal A.J.: "Large conductance switching and memory effects in organic molecules for data storage applications" Applied Physics Letters Bd. 82 (8) Feb. 24, 2003, pp. 1215-1217.
Ma L.P., Liu J., Yang Y.: "Organic electrical bistable devices and rewritable memory cells" Applied Physics Letters Bd.: 80(16), Apr. 22, 2002, pp. 2997-2999.
Duan H., Mays M.D., Cowan D.O., Kruger J.: "The importance of interfaces and phases in switching and memory systems containing semi-conducting charge-transfer complexes" Synthetic Metals, Bd.: 28, Nr.:1-2, Jan. 30, 1989, pp. 675-680.
Bozano L.D., Kean B.W., Deline V.R., Salem J.R., Scott J.C.: "Mechanism for bistability in organic memory elements" Applied Physics Letters Bd.: 84(4), Jan. 2004, pp. 607-609.
Tsujioka T., Kondo H.: "Organic bistable molecular memory using photochromic diarylethene" Applied Physics Letters, Aug. 4, 2003, Bd.: 83, Nr.: 5, pp. 937-939.
Pac S.-S., Saito G.: "Peculiarity of Hexamethylenetetratel-lurafulvalene (HMTTeF) Charge Transfer Complexes of Donar-Acceptor (D-A) Type" Journal of Solild State Chemistry, Bd.: 168, Nr.: 2, Nov. 1, 2002, pp. 486-496.

* cited by examiner

*Primary Examiner*—Cuong Nguyen
(74) *Attorney, Agent, or Firm*—Dicke, Billig & Czaja, PLLP

(57) ABSTRACT

A memory cell is provided which comprises two electrodes and a layer arranged in between and comprising an active material comprising (a) a compound selected from the group consisting of

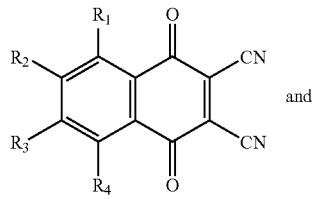

(Ia)

and

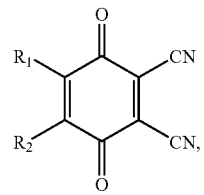

(Ib)

in which $R_1$ and $R_4$, independently of one another, may have the following meaning: —H, -alkyl, -aryl, -heteroaryl, —O-alkyl, —O-aryl, —O-heteroaryl, —SH, —S-alkyl, —S-aryl, —S-heteroaryl, —CO-alkyl, —CO-aryl, —CO-heteroaryl, —CS-alkyl, —CS-aryl, —CS-heteroaryl, -halogen, —CN and/or —$NO_2$, in which $R_1$ and $R_2$, $R_2$ and $R_3$, $R_3$ and $R_4$ together may form a ring, (b) a compound of the general formula II:

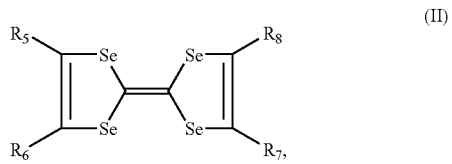

(II)

in which $R_5$ to $R_7$, independently of one another, may have the following meaning: —H, -alkyl, -aryl, -heteroaryl, —O-alkyl, —O-aryl, —O-heteroaryl, —$NH_2$, —$N(alkyl)_2$, —$N(aryl)_2$, —$N(heteroaryl)_2$, —SH, —S-alkyl, —S-aryl, —S-heteroaryl, —CO-alkyl, —CO-aryl, —CO-heteroaryl, —CS-alkyl, —CS-aryl, —CS-heteroaryl, -halogen, —CN and/or —$NO_2$,
in which $R_5$ and $R_6$ or $R_7$ and $R_8$ together may form a ring, and optionally
(c) a polymer.

A method for the production of the cells according to the invention and the novel use of a composition which can be used as active material for the memory cells are furthermore provided.

21 Claims, 2 Drawing Sheets

MEMORY CELL, METHOD FOR THE PRODUCTION THEREOF AND USE OF A COMPOSITION THEREFOR

CROSS-REFERENCE TO RELATED APPLICATIONS

This Utility Patent Application claims priority to German Patent Application No. DE 10 2004 004 863.0 filed on Jan. 30, 2004, which is incorporated herein by reference.

FIELD OF THE INVENTION

The present invention relates to a memory cell, a method for the production thereof and the use of a composition therefor.

BACKGROUND

One of the substantial efforts in the further development of modern memory technologies is to increase of the integration density, so that the reduction in the structure sizes of the memory cells on which the memory devices are based is very important.

In recent years, a plurality of microelectronic elements and in particular memory cells which have a size of a few nanometers has been described. One concept for the design of such memory cells comprises arranging, between two electrodes, an active layer which, depending on the voltage, can reversibly change certain properties, such as, for example, ferromagnetic properties or electrical resistance. Depending on the applied voltage, the cell can be switched between two states, so that one state can be assigned, for example, to the information state "0" and the other state to the information state "1".

Various memory cells having an active layer have been described according to the prior art.

The cell which has, between two electrodes, an active layer which can change the electrical resistance depending on the applied voltage has, compared with the cells which have a ferroelectric material between two electrodes, the advantage that it has a substantially higher signal ratio between the OFF and ON state and, after the read process, need not be rewritten since reading of the state is not destructive.

Bandyopadhyay et al.: Applied Physics Letters, Vol. 82, pages 1215-1217, "Large conductance switching memory effects in organic molecules for data-storage applications," describes an active layer arranged between two electrodes and consisting of rose Bengal (4,5,6,7-tetrachloro-2',4',5',7'-tetraiodofluorescein) with a polyallylamine hydrochloride polymer. The electrode consists of indium tin oxide on glass. The production of the active layer is, however, very inconvenient and requires treatment in an oven for several hours in vacuo. In addition, the active layer is limited to the indium tin oxide electrode.

A further memory cell having an active material which exhibits switchable behavior is described in Yang et al.: Applied Physics Letters, Vol. 80, 2002, pages 2997-2999, "Organic Electrical Bistable Devices and Rewritable Memory Cells." The active material consists of 2-amino-4, 5-imidazoledicarbonitrile (AIDCN). The memory cell according to this prior art consists of a plurality of layers which have the following composition: an aluminum anode deposited on glass, an AIDCN layer arranged thereon, a metal layer, a further AIDCN layer and a cathode. For switchability, this system requires the five layers described above, which makes the production very complex. A further disadvantage of the cells according to this prior art is that the cells can be switched only with aluminum electrodes and that the active layer can be applied only by means of vacuum vapor deposition.

SUMMARY

Embodiments of the invention provide a memory cell, a method for the production thereof, and the use of a composition therefore.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In one embodiment of the present invention provides a memory cell comprising an active layer arranged between two electrodes, the memory cell permitting a high integration density, being switchable between two stable states of different electrical resistance, being easy to process by conventional methods in microelectronics and permitting the use of the electrodes customary in microelectronics.

In another embodiment, the invention provides novel active materials which can be used in memory cells.

Figure 1:
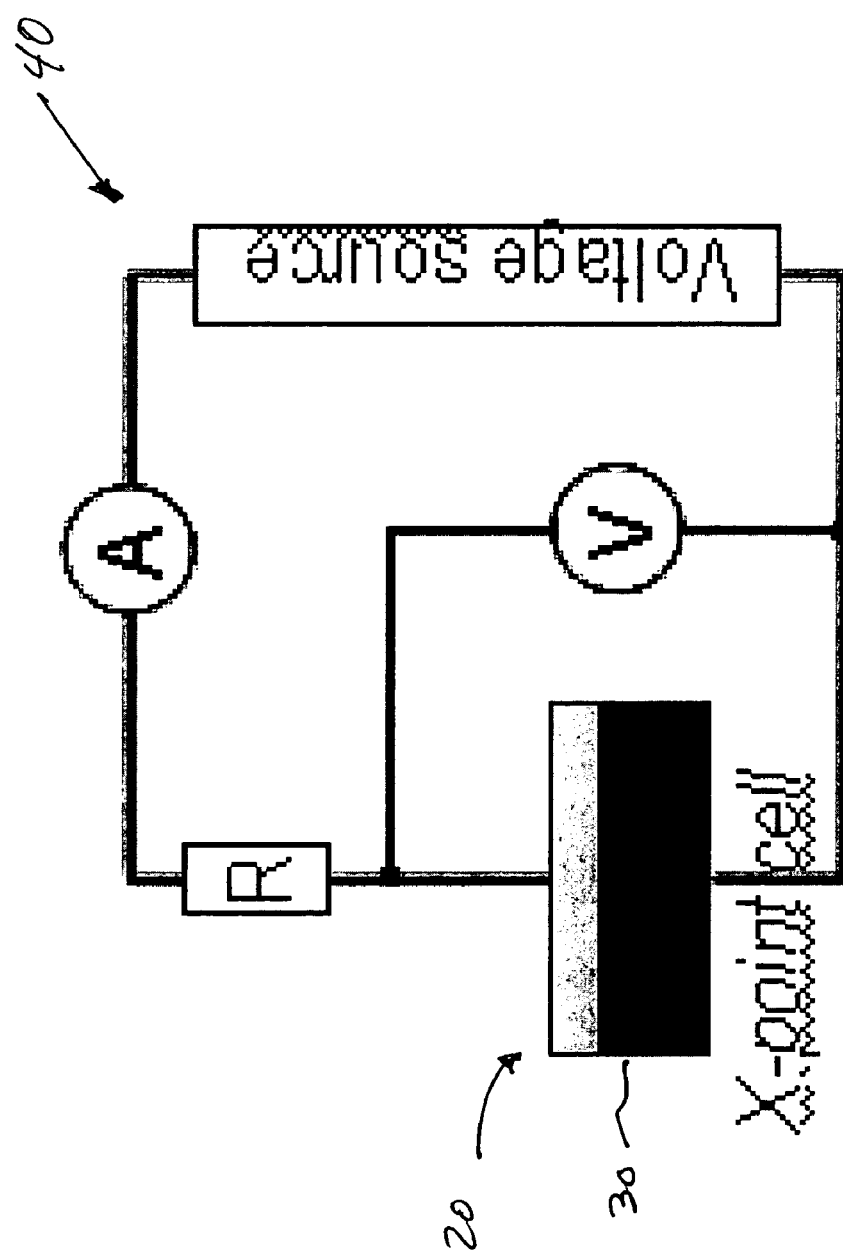
FIG. 1 illustrates one embodiment of a memory cell according to the invention, and in schematic form, a setup for the measurement of a current voltage characteristic.

In one embodiment, illustrated in FIG. 1 the invention includes a memory cell 20 having two electrodes and an active layer 30 arranged in between, the active layer 30 comprising (a) a compound selected from the group consisting of

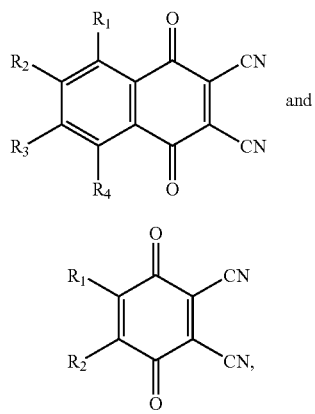

and in which $R_1$ to $R_4$, independently of one another, may have the following meaning:
—H, -alkyl, -aryl, -heteroaryl, —O-alkyl, —O-aryl, —O-heteroaryl, —SH, —S-alkyl, —S-aryl, —S-heteroaryl, —CO-alkyl, —CO-aryl, —CO-heteroaryl, —CS-alkyl, —CS-aryl, —CS-heteroaryl, -halogen, —CN and/or —$NO_2$, in which $R_1$ and $R_2$, $R_2$ and $R_3$, $R_3$ and $R_4$, together may form a ring; and (b) a compound of the general formula II:

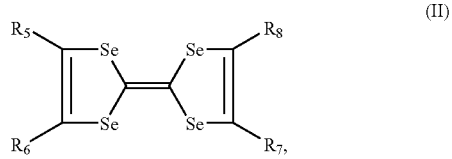

in which $R_5$ to $R_7$, independently of one another, may have the following meaning: —H, -alkyl, -aryl, -heteroaryl, —O-alkyl, —O-aryl, —O-heteroaryl, —$NH_2$, —$N(alkyl)_2$, —$N(aryl)_2$, —$N(heteroaryl)_2$, —SH, —S-alkyl, —S-aryl, —S-heteroaryl, —CO-alkyl, —CO-aryl, —CO-heteroaryl, —CS-alkyl, —CS-aryl, —CS-heteroaryl, -halogen, —CN and/or —$NO_2$, in which $R_5$ and $R_6$ or $R_7$ and $R_8$ together may form a ring; and optionally (c) a polymer.

The advantages of the cell design according to the invention are reversible switchability, a ratio of the ON to OFF resistances of 40 or more, nondestructive reading since there is no necessity of rewriting after reading, nonvolatile information storage, functionality down to film thicknesses of about 20 nm, high thermal stability, switchability in the presence of air and moisture, simpler and more economical design of the cell and suitability of the memory cell for production in a plurality of layers, such as, for example, by the copper damascene technique.

The ratio of the component (a) to (b) can be varied within wide ranges. In a particular embodiment, the ratio of (a) to (b) is in the range from 1:5 to 5:1.

The amount by weight of the polymer, based on the total amount of the active material, is in the range from 0 to 80 percent by weight.

In a particular embodiment, the amount by weight of the polymer, based on the total amount of the active material, is in the range from 40 to 60 percent by weight.

The optionally used polymer preferably serves as a film-forming carrier material and is not of decisive importance for the activity of the active material. In general, it is possible to use any polymer which has electronically insulating properties and is compatible with the components (a) and (b).

Particularly preferred polymers are, for example, polyether, polyacrylates, polyether sulfones, polyether sulfides, polyether ketones, polyquinolines, polyquinoxalines and polybenzoxazoles, polybenzimidazoles and polyimides or precursors thereof.

The polymer may be in the form of either a homopolymer or a copolymer having further polymerizable repeating units. The polymer may be present alone or as a blend of different polymers.

The substrate on which the electrodes have been applied or in which the electrodes have been incorporated may be silicon, germanium, gallium arsenide or gallium nitride or any desired material which contains any desired compound of silicon, germanium or gallium. Furthermore, the substrate may also be a polymer, i.e. plastic, which is filled or unfilled or is present as a molding or film, and may be ceramic, glass or metal. The substrate may also be a preprocessed material and contain one or more layers of contacts, conductor tracks, insulating layers and further microelectronic components.

In a preferred embodiment, the substrate is silicon which has already been processed according to front-end-of-line or FEOL, i.e. already contains electrical components, such as transistors, capacitors, etc., manufactured by the silicon technique. An insulating layer is preferably present between the substrate and the nearest electrode, particularly when the substrate is electrically conductive.

However, it is also possible for a plurality of layers to be present between the substrate and the nearest electrode.

The substrate may serve as carrier material or may perform an electrical function (evaluation, control). For the last-mentioned case, there are electrical contacts between the substrate and the electrodes which are applied to the substrate. These electrical contacts are, for example, contact holes (vias) filled with an electrical conductor. However, it is possible for the contacts to be effected from the lower into the upper layers by metallization in the edge regions of the substrate or of the chips.

The active layer according to the invention is compatible with a multiplicity of electrodes conventionally used in microelectronics. The electrodes preferably consist of Cu, Al, AlCu, AlSiCu, Ti, TiN, Ta, TaN, W, TiW, TaW, WN, WCN and customary combinations of these materials. Furthermore, thin layers of silicon, titanium silicon nitride, silicon oxynitride, silicon oxide, silicon carbide, silicon nitride or silicon carbonitride may also be present in combination with the abovementioned layers or materials.

The abbreviations, such as, for example, TiN, do not reproduce exact stoichiometric ratios since the ratio of the components can be changed as desired within possible limits.

Various methods are suitable for depositing the abovementioned electrode layers. These may be, for example, PVD, CVD, PECVD, vapor deposition, electroplating, electroless plating or atomic layer deposition (ALCVD). However, the methods are not limited to these and it is in principle possible to use all methods used in microelectronics for the production of electrodes.

The deposition of the electrode can be effected from the gas phase or from solution.

The electrodes can be structured by means of various customary techniques. The structuring can be effected, for example, by means of hole masks, printing techniques or lithography. In particular, screen printing, microcontact printing and nanoimprinting are particularly preferred as printing techniques.

However, the electrodes can also be structured, for example, by means of a damascene technique. For this purpose, for example, an insulating layer (preferably of silicon oxide) present above the substrate is structured by lithography and etching. After stripping of the photoresist, the electrode layer is deposited so that the trenches or holes in the insulating layer which are formed during the structuring are completely filled with the electrode materials. A part of these materials which projects above the surface of the insulating layer is then ground back. The grinding process can be effected by means of the CMP technique (chemical mechanical planarization). This results in, for example, conductor tracks and/or contact holes which are filled with the electrode materials and embedded in the insulating layer so that they have the same height as the insulating layer.

After the active material is deposited onto the electrode, the top electrode can be produced in exactly the same way as the bottom one. In a preferred embodiment of the invention, the upper conductor tracks are arranged transversely to the lower conductor tracks. Thus, a crosspoint cell, which consists of three layers, namely bottom electrode, active material and top electrode, forms at each point of intersection of the top electrode with the bottom electrode.

The lateral geometry of the cell is not limited to the abovementioned crosspoint arrangement; since, however, the crosspoint arrangement permits a very high integration density, it is preferred for the present invention.

The above-described sandwich structures of the memory cells, consisting of two electrodes and the layer present in between and comprising the active material, can be applied to the substrate not just once but several times in a form stacked one on top of the other. This results in a plurality of planes for the memory cells, each plane consisting of two electrodes and the layer present in between and comprising the active material. It is of course also possible for a plurality of cells to be in a plane (cell array). The various planes can be separated from one another by an insulator, or it is also possible to use not four but only three electrodes for two planes located one on top of the other, since it (middle electrode) can serve as the top electrode for the lower plane and as the bottom electrode for the upper plane.

The active material can be applied to the electrode by spin coating, for example, by preparation of a solution which contains the components (a) and (b) and optionally a polymer. Suitable solvents are, for example, N-methylpyrrolidone, γ-butyrolactone, methoxypropyl acetate, ethoxyethyl acetate, cyclohexanone, cyclopentanone, ethers of ethylene glycol, such as diethylene glycol diethyl ether, ethoxyethyl propionate or ethyl lactate. A mixture of the abovementioned solvents with optionally further solvents can also be used as the solvent. The formulation may also contain additives, such as, for example, addition promoters (for example silanes).

The active material can, however, also be applied by means of vacuum vapor deposition. For this purpose, the components (a) and (b) are deposited simultaneously on the electrode (co-evaporation) or the components are applied directly in succession and thus form the active layer without a polymer.

After spin coating or vacuum vapor deposition, a heating step is effected in each case, for example the substrate is treated on a hotplate or in an oven, in order to dry the film or optionally to complete the reaction, particularly when the components (a) and (b) are deposited on the electrode by means of vacuum vapor deposition. In the case of vacuum vapor deposition, the thermal treatment can, however, also be carried out in a vacuum chamber or even omitted.

The thickness of the layer which contains the active material is in the range of, preferably, between 20 and 2000 nm, the range between 20 and 200 nm being particularly preferred.

The advantages of the cell according to the invention are that the design of the cell is very simple so that the production can be effected economically. Only two electrodes and an active layer present in between are required for the cell according to the invention. The cell has a reversible, reproducible switchability under various conditions, such as, for example, in the presence of air and moisture and in a wide temperature range.

The active layer can be applied by means of line-compatible techniques, such as spin coating or vapor deposition, without special techniques being required for this purpose.

The adhesion of the layer to the electrodes is outstanding and the ratio of the state with low resistance to the state with higher resistance is greater than 40.

The production can be effected by means of customary lithographic processes since the active layer is compatible with a multiplicity of processes.

A particular advantage of the present cell is that the active layer is compatible with customary electrodes. The active layer is switchable with the electrodes and electrode combinations which are used in microelectronics, and the fact that the switchability is very reliable particularly with copper should be emphasized. This is important because copper has the lowest electrical resistance compared with the other electrical conductors which are used as standard in electronics. The production of the cell according to the invention is explained in more detail with reference to examples. The present invention is explained in more detail with reference to schematic drawings based on preferred embodiments.

EXAMPLES

Example 1

Production of the Bottom Electrode

The metal of the bottom electrode is applied to a silicon wafer having an insulating SiO or SiN surface by means of a vapor deposition method in a high vacuum or by a sputter method. Metals used may be all metals relevant in microelectronics, such as, for example, copper, aluminum, gold, titanium, tantalum, tungsten, titanium nitride or tantalum nitride. The structuring of the metals can be effected either by application of the metals via shadow masks or by lithographic structuring with subsequent etching by known methods of the metals applied over the entire surface.

Example 2

Preparation of Polymer Solutions 25 g of polyether, polyether sulfone, polyether ketone, polyimide, polybenzoxazole, polybenzimidazole or polymethacrylate are dissolved with 2.27 g of dichlorodicyano-p-benzoquinone and 4.07 g of tetraselenafulvalene in 70 g of distilled N-methylpyrrolidone (VLSI-Selectipur®) or distilled γ-butyrolactone (VLSI-Selectipur®). The dissolution process is expediently effected on a shaking apparatus at room temperature. The solution is then filtered under pressure through a 0.2 µm filter into a cleaned, particle-free glass sample tube. The viscosity of the polymer solution can be changed by varying the dissolved mass of polymer.

Example 3

Preparation of Polymer Solutions 20 g of polyether, polyether sulfone, polyether ketone, polyimide, polybenzoxazole, polybenzimidazole or polymethacrylate are dissolved with 2.27 g of dichlorodicyano-p-benzoquinone and 4.63 g of tetramethyltetraselenafulvalene in 60 g of distilled N-methylpyrrolidone (VLSI-Selectipur®) or distilled γ-butyrolactone (VLSI-Selectipur®). The dissolution process is expediently effected on a shaking apparatus at room temperature. The solution is then filtered under pressure through a 0.2 µm filter into a cleaned, particle-free glass sample tube. The viscosity of the polymer solution can be changed by varying the dissolved mass of polymer.

Example 4

Preparation of Polymer Solutions 10 g of polyether, polyether sulfone, polyether ketone, polyimide, polybenzoxazole, polybenzimidazole or polymethacrylate are dissolved with 1.04 g of tetracyno-p-benzoquinone and 2.32 g of tetramethyltetraselenafulvalene in 50 g of distilled N-methylpyrrolidone (VLSI-Selectipur®) or distilled γ-butyrolactone (VLSI-Selectipur®). The dissolution process is expediently effected on a shaking apparatus at room temperature. The solution is then filtered under pressure through a 0.2 µm filter into a cleaned, particle-free glass sample tube. The viscosity of the polymer solution can be changed by varying the dissolved mass of polymer.

Example 5

Improvement of the Adhesion by Adhesion Promoter Solutions

By using adhesion promoters, the adhesion of the polymers to surfaces relevant in microelectronics, such as, for example, silicon, silicon oxide, silicon nitride, tantalum nitride, tantalum, copper, aluminum, titanium or titanium nitride, can be improved.

For example, the following compounds can be used as adhesion promoters:

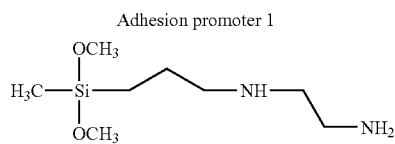

Adhesion promoter 1

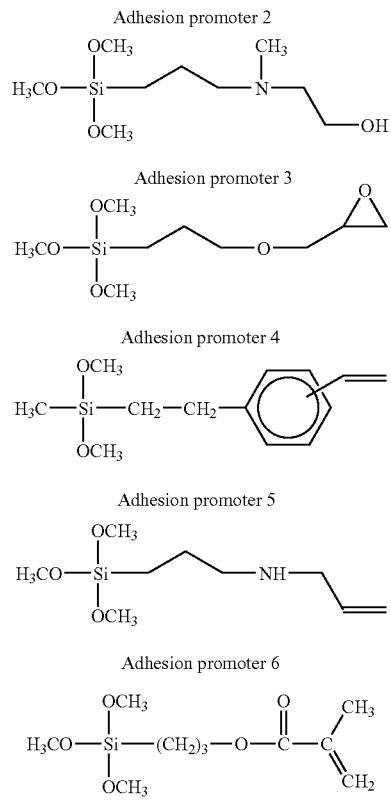

0.5 g of adhesion promoter (e.g. N-(2-aminoethyl)-3-aminopropylmethyldimethoxysilane) is dissolved in 95 g of methanol, ethanol or isopropanol (VLSI-Selectipur®) and 5 g of demineralized water in a cleaned, particle-free glass sample tube at room temperature. After standing for 24 h at room temperature, the adhesion promoter solution is ready for use. This solution can be used for at most 3 weeks. The adhesion promoter should give a monomolecular layer on the surface. The adhesion promoter can expediently be applied by the spin coating technique. For this purpose, the adhesion promoter solution is applied via a 0.2 µm prefilter and applied by spin coating for 30 s at 5000 rpm. A drying step is then effected for 60 s at 100° C.

Example 6

Application of a Polymer by the Spin Coating Method

On the silicon wafer processed according to example 1 or possibly processed silicon wafers pretreated according to example 5, the filtered solution of the polymer according to examples 2 to 4 is applied to the wafer by means of a syringe and distributed uniformly by means of a spin coater. The layer thickness should be in the range of 50-500 nm. The polymer is then heated on a hotplate for 1 min at 120° C. and for 4 min to 200° C.

Example 7

Vapor Deposition of the Active Components

In addition to the method for the application of the dissolved active components (donor and acceptor) in a polymer by spin coating, the components of the general formula (Ia) or (Ib) and of the general formula (II) can also be applied by the generally known method of co-evaporation. The two components of the general formula (Ia) or (Ib) and of the general formula (II) are co-evaporated as far as possible in a molar ratio of 1:1 up to a layer thickness of 10-300 nm onto the silicon wafer processed according to example 1. The wafer should be cooled to 10-30° C. thereby.

Example 8

Production of the Top Electrode Via a Shadow Mask

The metal of the top electrode is applied via a shadow mask by a vapor deposition method in a high vacuum or by a sputter method onto the silicon wafer processed according to example 6 or 7. Metals which may be used are all metals relevant in microelectronics, such as, for example, copper, aluminum, gold, titanium, tantalum, tungsten, titanium nitride or tantalum nitride.

Example 9

Production of the Top Electrode by a Lithographic Process

The metal of the top electrode is applied by a vapor deposition method in a high vacuum or by a sputter method to the entire surface of the silicon wafer processed according to example 6 or 7. Metals which may be used are all metals relevant in microelectronics, such as, for example, copper, aluminum, gold, titanium, tantalum, tungsten, titanium nitride or tantalum nitride. For structuring the top electrode, a photoresist is applied to the metal by a spin-on method and is exposed to light and structured. The metal not covered by the photoresist is then removed by etching by a known method. The photoresist still present is removed using a suitable stripper.

Example 10

Production of the Top Electrode by a Lift-Off Method

A photoresist is applied by a known method to the silicon wafer processed according to example 6 or 7 and is exposed to light and structured. The metal of the top electrode is then applied to the entire surface by a vapor deposition method in a high vacuum or by a sputter method. Metals which may be used are all metals relevant in microelectronics, such as, for example, copper, aluminum, gold, titanium, tantalum, tungsten, titanium nitride or tantalum nitride. The photoresist and the metal adhering to it are removed by a lift-off process.

Example 11

Measurement of the I(U) Characteristic

Figure 2:
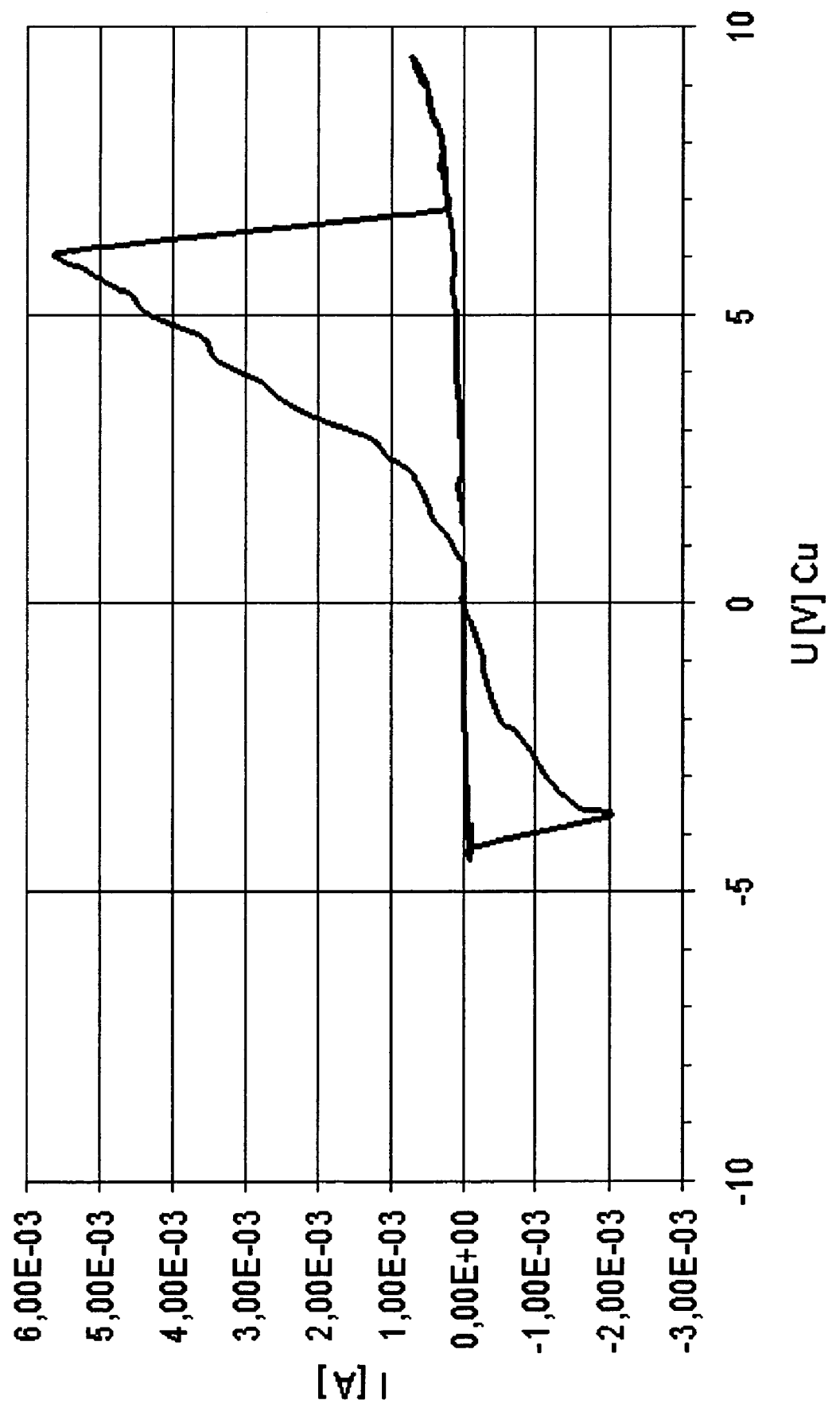
FIG. 2 illustrates a graph in which the current-voltage characteristic of a memory cell according to one embodiment of the invention is explained.

The measurement of the I(U) characteristic is effected according to the circuit diagram illustrated generally at 40 in FIG. 1:

In one embodiment, a meter commercially available under the name SourceMeter Series 2400 from Keithley was used for the measurement. The cells show a typical I(U) characteristic, as shown in FIG. 2: The cells switch from a high-impedance state at about −4.2 V onwards to a stable low-impedance state and at +6 V back to a stable high impedance state. These two different resistive states are also stable when no voltage is applied.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory cell comprising:
  a first electrode;
  a second electrode; and
  an active layer which is arranged between the first and the second electrode, the active layer comprising the following components:
  a) a compound selected from the group consisting of

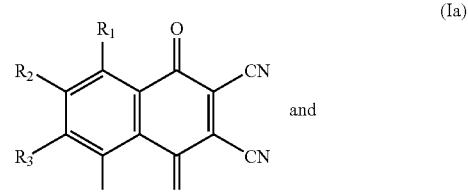

(Ia)

and

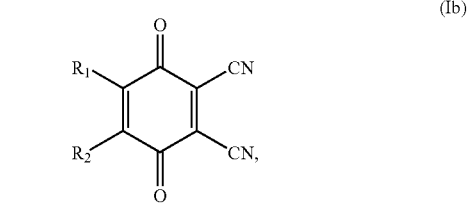

(Ib)

in which $R_1$ and $R_4$, independently of one another, have the following meaning: —H, -alkyl, -aryl, -heteroaryl, —O-alkyl, —O-aryl, —O-heteroaryl, —SH, —S-alkyl, —S-aryl, —S-heteroaryl, —CO-alkyl, —CO-aryl, —CO-heteroaryl, —CS-alkyl, —CS-aryl, —CS-heteroaryl, -halogen, —CN and/or —$NO_2$, in which $R_1$ and $R_2$, $R_2$ and $R_3$, $R_3$ and $R_4$ together may form a ring, (b) a compound of the general formula II:

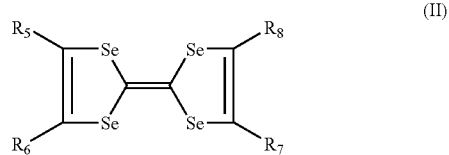

(II)

in which $R_5$ to $R_7$, independently of one another, may have the following meaning: —H, -alkyl, -aryl, -heteroaryl, —O-alkyl, —O-aryl, —O-heteroaryl, —$NH_2$, —$N(alkyl)_2$, —$N(aryl)_2$, —$N(heteroaryl)_2$, —SH, —S-alkyl, —S-aryl, —S-heteroaryl, —CO-alkyl, —CO-aryl, —CO-heteroaryl, —CS-alkyl, —CS-aryl, —CS-heteroaryl, -halogen, —CN and/or —$NO_2$, in which $R_5$ and $R_6$ or $R_7$ and $R_8$ together may form a ring.

2. The memory cell of claim 1, wherein the ratio of the components (a) to the component (b) has a value of 5:1 to 1:5.

3. The memory cell of claim 1, wherein the memory cell is applied to a substrate selected from the group consisting of silicon, germanium, gallium arsenide, gallium nitride, any desired compound of silicon, germanium or gallium, a polymer, ceramic, glass and metal.

4. The memory cell of claim 1, wherein the thickness of the active material is between 20 and 2000 nm.

5. The memory cell of claim 4, wherein the thickness of the active material is between 20 and 200 nm.

6. The memory cell of claim 1, wherein the first or the second electrode consist of copper, aluminum, aluminum-copper, aluminum-silicon-copper, titanium, tantalum, tungsten, titanium nitride, TiW, TaW, WN, WCN or tantalum nitride and combinations thereof.

7. The memory cell of claim 1, wherein the first and the second electrode consist of copper, aluminum, aluminum-copper, aluminum-silicon-copper, titanium, tantalum, tungsten, titanium nitride, TiW, TaW, WN, WCN or tantalum nitride and combinations thereof.

8. The memory cell of claim 1, wherein the first electrode is rotated by 40° to 140°, relative to the second electrode.

9. The memory cell of claim 1, wherein the first electrode is rotated by substantially 90°, relative to the second electrode.

10. A memory cell comprising:
a first electrode a second electrode; and
an active layer which is arranged between the first and the second electrode, the active layer comprising the following components:
a) a compound selected from the group consisting of

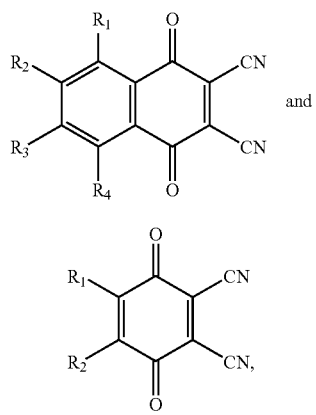

(Ia)

(Ib)

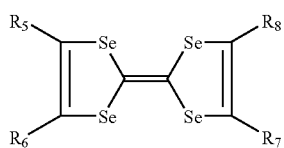

in which $R_1$ and $R_4$, independently of one another, have the following meaning: —H, -alkyl, -aryl, -heteroaryl, —O-alkyl, —O-aryl, —O-heteroaryl, —SH, —S-alkyl, —S-aryl, —S-heteroaryl, —CO-alkyl, —CO-aryl, —CO-heteroaryl, —CS-alkyl, —CS-aryl, —CS-heteroaryl, -halogen, —CN and/or —NO$_2$, in which $R_1$ and $R_2$, $R_2$ and $R_3$, $R_3$ and $R_4$ together may form a ring, (b) a compound of the general formula II:

(II)

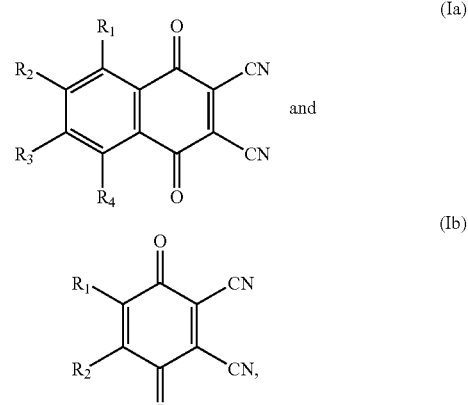

in which $R_5$ to $R_7$, independently of one another, have the following meaning: —H, -alkyl, -aryl, -heteroaryl, —O-alkyl, —O-aryl, —O-heteroaryl, —NH$_2$, —N(alkyl)$_2$, —N(aryl)$_2$, —N(heteroaryl)$_2$, —SH, —S-alkyl, —S-aryl, —S-heteroaryl, —CO-alkyl, —CO-aryl, —CO-heteroaryl, —CS-alkyl, —CS-aryl, —CS-heteroaryl, -halogen, —CN and/or —NO$_2$, in which $R_5$ and $R_6$ or $R_7$ and $R_8$ together may form a ring.

11. The memory cell of claim 10, wherein the amount by weight of the polymer, based on the total amount of the active material, is in the range between 0 and 80 percent by weight.

12. The memory cell of claim 10, wherein the polymer is a film-forming carrier material.

13. The memory cell of claim 10, wherein the polymer is selected from the group consisting of polyether, polyether sulfones, polyacrylates, polyether sulfides, polyether ketones, polyquinolines, polyquinoxalines, polybenzoxazoles, polybenzimidazoles and polyimides.

14. A method for the production of a memory cell, comprising:
providing a substrate;
structuring a first electrode; and
depositing a layer containing the components
a) a compound selected from the group consisting of (Ia)

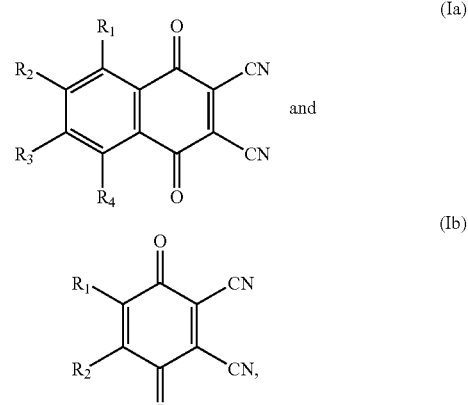

(Ib)

in which $R_1$ and $R_4$, independently of one another, have the following meaning: —H, -alkyl, -aryl, -heteroaryl, —O-alkyl, —O-aryl, —O-heteroaryl, —SH, —S-alkyl, —S-aryl, —S-heteroaryl, —CO-alkyl, —CO-aryl, —CO-heteroaryl, —CS-alkyl, —CS-aryl, —CS-heteroaryl, -halogen, —CN and/or —NO$_2$, in which $R_1$ and $R_2$, $R_2$ and $R_3$ and/or $R_3$ and $R_4$ together may form a ring,
and
(b) a compound of the general formula II:

(II)

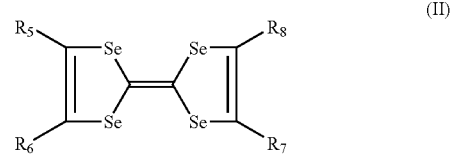

in which $R_5$ to $R_7$, independently of one another, have the following meaning: —H, -alkyl, -aryl, -heteroaryl, —O-alkyl, —O-aryl, —O-heteroaryl, —NH$_2$, —N(alkyl)$_2$, —N(aryl)$_2$, —N(heteroaryl)$_2$, —SH, —S-alkyl, —S-aryl, —S-heteroaryl, —CO-alkyl, —CO-aryl, —CO-heteroaryl, —CS-alkyl, —CS-aryl, —CS-heteroaryl, -halogen, —CN and/or —NO$_2$, in which R₅ and R₆ or R₇ and R₈ together may form a ring;
depositing a second electrode onto the active material.

15. The method of claim 14, wherein the deposition of components (a) and (b) is effected by means of vacuum vapor deposition.

16. The method of claim 14, wherein deposition of the active material is effected by spin coating of a solution containing components (a), (b) and (c).

17. A method for the production of a memory cell, comprising:
providing a substrate;
structuring a first electrode; and
depositing a layer containing the components
a) a compound selected from the group consisting of

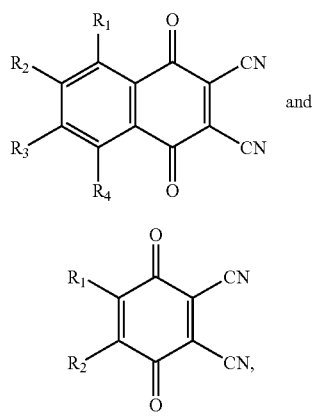

in which $R_1$ and $R_4$, independently of one another, have the following meaning: —H, -alkyl, -aryl, -heteroaryl, —O-alkyl, —O-aryl, —O-heteroaryl, —SH, —S-alkyl, —S-aryl, —S-heteroaryl, —CO-alkyl, —CO-aryl, —CO-heteroaryl, —CS-alkyl, —CS-aryl, —CS-heteroaryl, -halogen, —CN and/or —NO₂, in which $R_1$ and $R_2$, $R_2$ and $R_3$ and/or $R_3$ and $R_4$ together may form a ring,
and
(b) a compound of the general formula II:

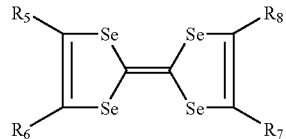

in which R₅ to R₇, independently of one another, have the following meaning: —H, -alkyl, -aryl, -heteroaryl, —O-alkyl, —O-aryl, —O-heteroaryl, —NH₂, —N(alkyl)₂, —N(aryl)₂, —N(heteroaryl)₂, —SH, —S-alkyl, —S-aryl, —S-heteroaryl, —CO-alkyl, —CO-aryl, —CO-heteroaryl, —CS-alkyl, —CS-aryl, —CS-heteroaryl, -halogen, —CN and/or —NO₂,
in which R₅ and R₆ or R₇ and R₈ together may form a ring;
and (c) a polymer,
deposition of a second electrode onto the active material.

18. The method of claim 14, wherein the deposition of components (a) and (b) is effected by means of vacuum vapor deposition.

19. The method of claim 14, wherein deposition of the active material is effected by spin coating of a solution containing components (a), (b) and (c).

20. The use of a composition for the production of a semiconductor element, the composition comprising the following components:
a) a compound selected from the group consisting of

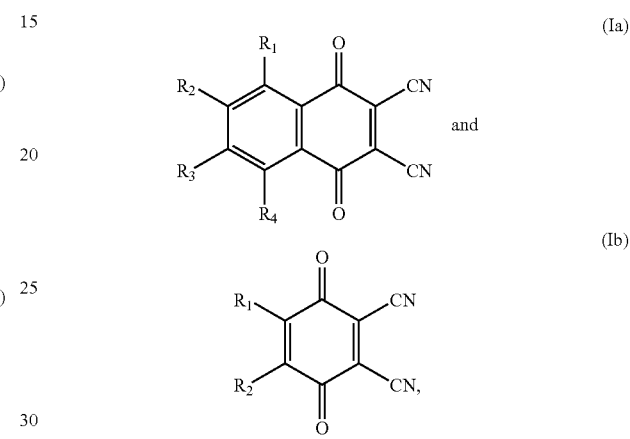

in which $R_1$ and $R_4$, independently of one another, have the following meaning: —H, -alkyl, -aryl, -heteroaryl, —O-alkyl, —O-aryl, —O-heteroaryl, —SH, —S-alkyl, —S-aryl, —S-heteroaryl, —CO-alkyl, —CO-aryl, —CO-heteroaryl, —CS-alkyl, —CS-aryl, —CS-heteroaryl, -halogen, —CN and/or —NO₂, in which $R_1$ and $R_2$, $R_2$ and $R_3$, $R_3$ and $R_4$ together may form a ring,
(b) a compound of the general formula II:

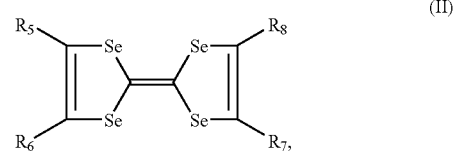

in which R₅ to R₇, independently of one another, have the following meaning: —H, -alkyl, -aryl, -heteroaryl, —O-alkyl, —O-aryl, —O-heteroaryl, —NH₂, —N(alkyl)₂, —N(aryl)₂, —N(heteroaryl)₂, —SH, —S-alkyl, —S-aryl, —S-heteroaryl, —CO-alkyl, —CO-aryl, —CO-heteroaryl, —CS-alkyl, —CS-aryl, —CS-heteroaryl, -halogen, —CN and/or —NO₂,
in which R₅ and R₆ or R₇ and R₈ together may form a ring.

21. The use of the composition of claim 20, the composition further comprising a polymer.

* * * * *